(12) United States Patent
Li

(10) Patent No.: US 11,227,877 B2
(45) Date of Patent: Jan. 18, 2022

(54) ARRAY SUBSTRATES AND MANUFACTURING METHODS THEREOF AND DISPLAY SCREENS

(71) Applicant: Kunshan Go-Visionox Opto-Electronics Co., Ltd., Kunshan (CN)

(72) Inventor: Yao Li, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 452 days.

(21) Appl. No.: 16/342,197

(22) PCT Filed: Jun. 20, 2018

(86) PCT No.: PCT/CN2018/092036
§ 371 (c)(1),
(2) Date: Apr. 15, 2019

(87) PCT Pub. No.: WO2019/105014
PCT Pub. Date: Jun. 6, 2019

(65) Prior Publication Data
US 2021/0327919 A1    Oct. 21, 2021

(30) Foreign Application Priority Data
Nov. 30, 2017 (CN) .......................... 201711240599.6

(51) Int. Cl.
*H01L 27/12* (2006.01)
(52) U.S. Cl.
CPC ...... *H01L 27/1244* (2013.01); *H01L 27/1218* (2013.01); *H01L 27/1262* (2013.01)

(58) Field of Classification Search
CPC ............... H01L 27/3288; H01L 51/525; H01L 2227/323; H01L 51/5253
See application file for complete search history.

(56) References Cited

U.S. PATENT DOCUMENTS

2004/0124763 A1   7/2004 Nathan et al.
2016/0240602 A1   8/2016 Ki et al.
(Continued)

FOREIGN PATENT DOCUMENTS

CN   106206615 A   * 12/2016
CN   106486520 A     3/2017
(Continued)

OTHER PUBLICATIONS

Notice of Allowance of Chinese Patent Application No. 201711240599.6 dated Sep. 27, 2020.
(Continued)

*Primary Examiner* — Sitaramarao S Yechuri
(74) *Attorney, Agent, or Firm* — Kilpatrick Townsend & Stockton

(57) ABSTRACT

An array substrate includes a display region and a non-display region located outside the display region. The non-display region includes a flexible underlay and an inorganic film layer. A surface of the flexible underlay is provided with a number of slots thereon. The plurality of slots including a pair of adjacent slots. A region positioned between the adjacent slots on the flexible underlay is a trace region. The inorganic film layer includes a first inorganic film layer formed in the trace region and a second inorganic film layer formed on a bottom wall of the slots. The first inorganic film layer and the second inorganic film layer are divided by sidewalls of the slots. A peripheral metal trace is formed on the surface of the first inorganic film layer.

20 Claims, 2 Drawing Sheets

(56) References Cited

U.S. PATENT DOCUMENTS

| | | |
|---|---|---|
| 2017/0062760 A1 | 3/2017 | Kim |
| 2017/0170206 A1 | 6/2017 | Lee et al. |
| 2017/0188463 A1 | 6/2017 | Kim et al. |
| 2017/0194404 A1 | 7/2017 | Park et al. |
| 2017/0288005 A1 | 10/2017 | Kawata |
| 2018/0088390 A1* | 3/2018 | Ohara ................. H01L 27/3276 |

FOREIGN PATENT DOCUMENTS

| | | | | |
|---|---|---|---|---|
| CN | 106887447 A | | 6/2017 | |
| CN | 106935628 A | | 7/2017 | |
| CN | 107275337 A | | 10/2017 | |
| CN | 109216576 A | * | 1/2019 | ......... H01L 51/5253 |
| JP | 2003222898 A | | 8/2003 | |
| TW | I621050 B | | 4/2018 | |

OTHER PUBLICATIONS

Office Action of Chinese Patent Application No. 201711240599.6 dated Mar. 2, 2020.
International Search Report and Written Opinion of International Application No. PCT/CN2018/092036.
TW Office Action dated Dec. 26, 2018 in the corresponding TW application (application No. 107126042).

* cited by examiner

ARRAY SUBSTRATES AND MANUFACTURING METHODS THEREOF AND DISPLAY SCREENS

CROSS-REFERENCE TO RELATED APPLICATIONS

This application is a U.S. national Stage of International Application No. PCT/CN2018/092036, filed on Jun. 20, 2018, designating the United States, which claims priority to Chinese Patent Application No. 201711240599.6, filed with the Chinese Patent Office on Nov. 30, 2017 and entitled "ARRAY SUBSTRATE AND MANUFACTURING METHOD THEREOF AND DISPLAY SCREEN", the content of each of which is hereby incorporated by reference in its entirety.

FIELD

The present disclosure relates to the technical field of display, and in particular, relates to array substrates and manufacturing methods thereof, and display screens.

BACKGROUND

A display screen includes a display region (AA region) and a non-display region (non-AA region), and the non-display region is required to be able to flex in order to achieve certain functions. For example, in order to narrow a frame, the non-display region is flexed to the back of the screen body, thereby reducing the frame width.

However, in the current display screen, in the flexing process of the non-display region, the peripheral metal traces in the non-display region are easily fractured, thereby causing the screen to be defective.

SUMMARY

Accordingly, it is necessary to provide an array substrate that can effectively prevent fracture of the peripheral metal traces.

An array substrate, including a display region and a non-display region located outside the display region; the non-display region including:
a flexible underlay, the flexible underlay having a plurality of slots defined on a surface thereof, the plurality of slots including a pair of adjacent slots, a region positioned between the adjacent slots on the flexible underlay being a trace region;
an inorganic film layer including a first inorganic film layer formed in the trace region and a second inorganic film layer formed on a bottom wall of the plurality of slots, the first inorganic film layer and the second inorganic film layer are divided by sidewalls of the slots; and
a peripheral metal trace formed on the surface of the first inorganic film layer.

According to the array substrate, the surface of the flexible underlay is provide with slots, so that the inorganic film layer can be divided to form the first inorganic film lay and the second inorganic film layer, the first inorganic film layer is located in the trace region and the second inorganic film lay is located on the bottom wall of the slots, i.e., the inorganic film layer can be separated into several parts independent from each other when the inorganic film layer is deposited, thereby reducing the flexing stress of the inorganic film layer when the non-display region is flexed, effectively avoiding the fracture of the inorganic film layer and the fracture of the peripheral metal traces, therefore the reliability of the array substrate is improved In an embodiment, angles between the sidewalls of the slots and the bottom walls of the slot are less than 90 degrees.

In an embodiment, a cross-section of the slots is characterized by an isosceles trapezoid shape.

In an embodiment, a cross-section of the sidewall of the slots is arc-shaped.

In an embodiment, a depth of the slots is greater than 1 micron.

In an embodiment, the plurality of the slots is provided between two adjacent metal traces.

In an embodiment, the array substrate further includes a protective layer formed on a surface of the peripheral metal trace.

In an embodiment, the flexible underlay includes a flexible underlay body layer and a flexible underlay surface layer.

In an embodiment, the slots pass through the flexible underlay surface layer.

In an embodiment, a width of the first inorganic film layer is greater than a width of the peripheral metal trace.

In an embodiment, a thickness of the flexible underlay surface layer is equal to the depth of the slot.

In an embodiment, the flexible underlay surface layer is a patterned flexible underlay surface layer, and a hollow region of the flexible underlay surface layer and the flexible underlay body layer constitute the slot.

A display screen, including the array substrate provided herein.

The display screen includes the array substrate provided herein, the structure of the non-display region of the array substrate provided by the disclosure can effectively prevent the peripheral metal traces from fracture, thereby better ensuring the transmission of signals and increasing the service life of the display screen A manufacturing method of an array substrate, the array substrate includes a non-display region, the manufacturing method of the non-display region includes:
providing a flexible underlay;
forming slots on the flexible underlay;
forming a first inorganic film layer on a surface of the flexible underlay;
forming a second inorganic film layer on a bottom wall of the slots; and
forming a peripheral metal trace on a surface of the first inorganic film layer.

In an embodiment, the forming of the slots on the flexible underlay includes:
providing a flexible underlay body layer; and
forming a patterned flexible underlay surface layer on the flexible underlay body layer such that a hollow region of the flexible underlay surface layer and the flexible underlay body layer form the slots.

According to the array substrate prepared by the manufacturing method of the array substrate, the inorganic film layer can be directly divided into several parts independent from each other when the inorganic film layer is deposited, thereby reducing the flexing stress of the inorganic film layer when the non-display region is flexed and further the avoiding fracture of the inorganic film layer, therefore the fracture of the peripheral metal trace is effectively avoided.

DETAILED DESCRIPTION OF THE EMBODIMENTS

The present disclosure will be described in details in combination with the accompanying drawings and embodiments such that the purpose, technical solution and advantages of the present disclosure will be more apparent. It should be understood that the particular embodiments are described for the purpose of illustrating as opposed to restricting the present disclosure.

It will be understood that when an element is referred to as being "disposed" or "configured" on another element, it can be directly on the other element or intervening elements may be present. When an element is referred to as being "connected" to another element, it can be directly connected to the other element or intervening elements may be present. The terms "vertical," "horizontal," "left," "right" and the like are used for illustrative purposes only and do not suggest that they are the only embodiments.

Figure 1:
FIG. 1 is a schematic diagram of a structure of an array substrate according to a first embodiment of the disclosure.
Figure 2:
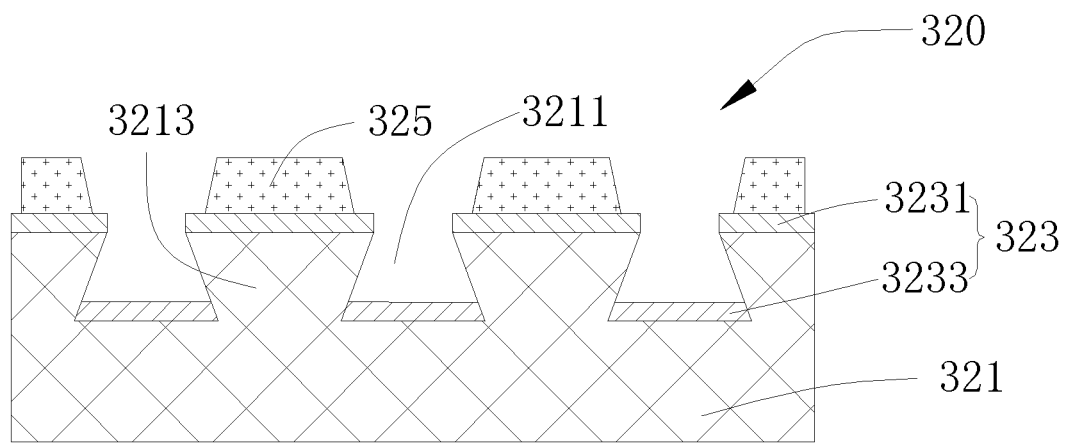
FIG. 2 is a cross-sectional view of a non-display region of the array substrate shown in FIG. 1.

As shown in FIGS. 1 to 2, the array substrate 300 according to the first embodiment of the disclosure includes a display region 310 and a non-display region 320 located outside the display region.

The display region 310 (i.e., the AA region) is a region in the array substrate 100 corresponding to the pixel unit, and electronic components, such as a thin film transistor and a capacitor, are provided in the display region 310 to drive the pixel unit. The disclosure is not particularly limited to the specific structure of the display region 310, and various structures deemed suitable by those skilled in the art may be adopted, and are omitted for brevity.

In the embodiment, the non-display region 320 (i.e., the non-AA region) is located on the side of the display region 310. Of course, the non-display region 320 may also exist at other positions outside the display region 310.

The non-display region 320 includes a flexible underlay 321, an inorganic film layer 323, and a peripheral metal trace 325.

Specifically, the flexible underlay 321 includes one or more layers of flexible underlays. The surface of the flexible underlay 321 is provided with a plurality of slots 3211, and a region between adjacent slots 3211 on the flexible underlay 321 is a trace region 3213.

The inorganic film layer 323 includes a first inorganic film layer 3231 simultaneously formed in the trace region 3213, and a second inorganic film layer 3233 formed on the bottom wall of the slots 3211. The second inorganic film layer 3233 and the first inorganic film layer 3231 are divided by sidewalls of the slots 3211. The peripheral metal trace 325 is formed on the surface of the first inorganic film layer 3231.

The second inorganic film layer 3233 and the first inorganic film layer 3231 are divided by the sidewalls of the slot 3211. That is, the inorganic film layer 323 are divided into several parts independent from each other, thereby reducing the flexing stress of the inorganic film layer 323 when the non-display region 320 is flexed, and effectively avoiding fracture of the inorganic film layer 323 and further the fracture of the peripheral metal traces 325, therefore the reliability of the array substrate 300 is improved.

The sidewall of the slot 3211 has a wall section concave to the outside of the slot 3211, for example, the sidewall of the slot 3211 is an inclined wall or a cross-section of the sidewalls of the slots 3211 is arc-shaped. In such a structure, the first inorganic film layer 3231 and the second inorganic film layer 3233 can be completed by one inorganic material deposition process, and a ramp fracture phenomenon is caused at the edge of the slot 3211 when the inorganic material is deposited, such that the first inorganic film layer 3231 and the second inorganic film layer 3233 are independent from each other.

Alternatively, in the embodiment, angles between the sidewalls of the slots 3211 and the bottom walls of the slots 3211 are less than 90 degrees, that is, the sidewall of the slot 3211 is an inclined wall recessed toward the outside of the slot 3211. This configuration is simple in structure and easy to be implemented. Further alternatively, a cross-section of the slots 3211 is characterized by an isosceles trapezoid shape, that is, the section of the slot 3211 perpendicular to the extending direction of the slot 3211 is an isosceles trapezoid shape. The flexing stress at the time of flexing of the non-display region 320 is made even throughout, and the phenomenon of stress concentration is avoided.

The depth of the slot 3211 is greater than the thickness of the inorganic film layer 323, so that when the inorganic film layer 323 is deposited, the first inorganic film layer 3231 and the second inorganic film layer 3233 are divided by the sidewalls of the slots 3211. Alternatively, a depth of the slots 3211 is greater than 1 micron, so that a sufficient flexing stress of the inorganic film layer can be released, ensuring that the inorganic film layer is prevented from fracture.

In the embodiment, the slots 3211 are evenly distributed, and the sizes of the slots 3211 are the same, which facilitates processing. Of course, the distribution of the slots 3211 may not be even if needed, and the sizes of the slots 3211 may not be identical.

Further, the width of the first inorganic film layer 3231 is greater than or equal to the width of the peripheral metal trace 325, so that the peripheral metal trace 325 can be completely located on the first inorganic film layer 3231 without passing through the slot 3211, therefore, the ramp fracture phenomenon of the peripheral metal trace 325 is avoided, that is, the peripheral metal trace 325 can be prevented from fracture, and the reliability of signal transmission is ensured.

In the embodiment, there is only one slot 3211 between adjacent peripheral metal traces 325. It should be noted that the plurality of the slots 3211 may be provided between two adjacent metal traces 325, so that more flexing stress of the inorganic film layer 323 can be released to prevent the inorganic film layer 323 from fracture, thereby preventing fracture of the peripheral metal traces 325.

In another embodiment, the non-display region 320 of the array substrate 300 further includes a protective layer formed on the surface of the peripheral metal traces 325 to prevent the peripheral metal traces 325 from contacting water and oxygen and causing oxidation of the peripheral metal traces 325.

Figure 3:
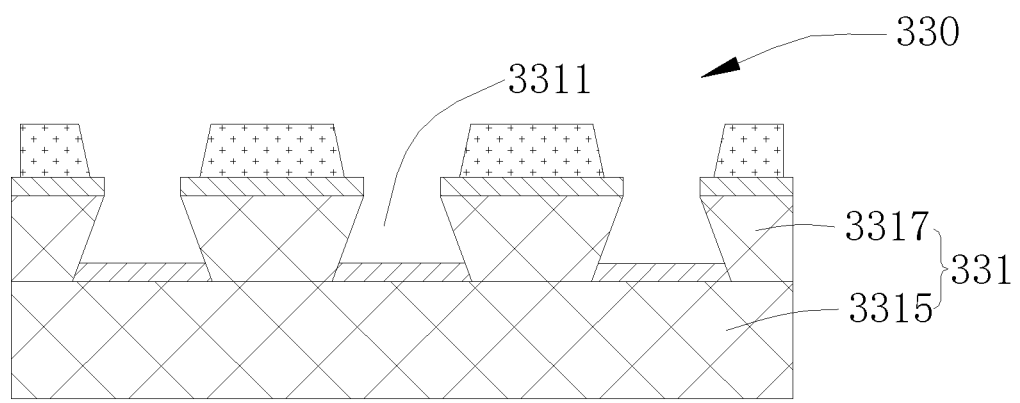
FIG. 3 is a cross-sectional view of a non-display region of an array substrate according to a second embodiment of the disclosure.

As shown in FIG. 3, the array substrate provided in the second embodiment of the disclosure, unlike the array substrate 300, the flexible underlay 331 includes a flexible underlay body layer 3315 and a flexible underlay surface layer 3317. The slot 3311 penetrates the flexible underlay surface layer 3317. The flexible underlay body layer 3315 includes one or more flexible substrates, and the flexible underlay surface layer 3317 includes one or more flexible substrates. Alternatively, the thickness of the flexible underlay surface layer 3317 may be controlled to be equal to the depth of the slot 3311 so that that the hollow region of the flexible underlay surface layer 3317 and the flexible underlay body layer 3315 may form a slot 3311 by forming the patterned flexible underlay surface layer 3317 on the surface of the flexible underlay body layer 3315.

It will be appreciated that the depth of the slot 3311 may also be greater or less than the thickness of the flexible underlay skin 3317 as long as the etch depth is precisely controlled. However, it should be ensured that the depth of the slot 3311 is greater than the thickness of the inorganic film layer, so that when the inorganic film layer is deposited, the first inorganic film layer of the trace region is separated from the second inorganic film layer on the bottom wall of the slots 3311 by the sidewalls of the slot 3311.

The disclosure provides a display screen including the array substrate provided herein.

It should be noted that the display screen includes other devices in addition to the array substrate, and the specific structure of the other devices and the connection between the devices can adopt structures well known to those skilled in the art and are omitted for brevity.

The structure of the non-display region of the array substrate provided by the disclosure can effectively prevent the peripheral metal traces from fracture, thereby better ensuring the transmission of signals and increasing the service life of the display screen.

The disclosure provides a manufacturing method of an array substrate. The manufacturing method of the non-display region of the array substrate specifically includes the following steps:

In step S1: providing a flexible underlay and forming slots on the flexible underlay.

Specifically, the slots may be formed directly on the surface of the flexible underlay by etching or the like.

In another embodiment, the flexible underlay includes a flexible underlay body layer and a flexible underlay surface layer. The flexible underlay body layer includes at least one layer of a flexible substrate; the flexible underlay surface layer includes at least one layer of a flexible substrate. The forming of a plurality of slots on the surface of the flexible underlay is:

Providing a flexible underlay body layer;

Forming a patterned flexible underlay surface layer on the flexible underlay body layer such that the hollow region of the flexible underlay surface layer and the flexible underlay body layer form the slots.

Specifically, the patterned flexible underlay surface layer may be formed on the flexible underlay body layer by a mask or the like.

In step S2: depositing an inorganic film layer to form a plurality of first inorganic film layers and a plurality of second inorganic film layers on a surface of the flexible underlay.

Specifically, forming a first inorganic film layer in the trace region of the flexible underlay, and forming a second inorganic film layer on the bottom wall of the slots.

In step S3: forming a peripheral metal trace on a surface of the first inorganic film layer.

It should be noted that the array substrate includes a display region and a non-display region, and the manufacturing method of the display region can be a manufacturing method known to a person skilled in the art and are omitted for brevity.

According to the array substrate prepared by the manufacturing method of the array substrate, the inorganic film layer can be directly divided into several parts independent from each other when the inorganic film layer is deposited, thereby reducing the flexing stress of the inorganic film layer when the non-display region is flexed and further avoiding fracture of the inorganic film layer, therefore the fracture of the peripheral metal trace is effectively avoided.

According to the array substrate, the surface of the flexible underlay is provide with slots, so that the inorganic film layer can be divided to form the first inorganic film lay and the second inorganic film layer, the first inorganic film layer is located in the trace region and the second inorganic film lay is located on the bottom wall of the slots, i.e., the inorganic film layer can be separated into several parts independent from each other when the inorganic film layer is deposited, thereby reducing the flexing stress of the inorganic film layer when the non-display region is flexed, effectively avoiding the fracture of the inorganic film layer and the fracture of the peripheral metal traces, therefore the reliability of the array substrate is improved.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

Although the invention is illustrated and described herein with reference to specific embodiments, the invention is not intended to be limited to the details shown.

The invention claimed is:

1. An array substrate, comprising a display region and a non-display region located outside the display region,
    the non-display region comprising:
    a flexible underlay, the flexible underlay having a plurality of slots recessed from a surface of the flexible underlay, the plurality of slots including a pair of adjacent slots, a region positioned between the adjacent slots on the flexible underlay being a trace region;
    an inorganic film layer comprising a first inorganic film layer formed in the trace region and a second inorganic film layer formed on a bottom wall of the plurality of slots, the first inorganic film layer and the second inorganic film layer being divided by sidewalls of the slots; and
    a peripheral metal trace formed on the surface of the first inorganic film layer;
    a protective layer formed on a surface of the peripheral metal trace.

2. The array substrate according to claim 1, wherein angles between the sidewalls of the slots and the bottom walls of the slots are less than 90 degrees.

3. The array substrate according to claim 2, wherein a cross-section of the slots is characterized by an isosceles trapezoid shape.

4. The array substrate according to claim 1, wherein a cross-section of the sidewalls of the slots is arc-shaped.

5. The array substrate according to claim 1, wherein a depth of the slots is greater than 1 micron.

6. The array substrate according to claim 1, wherein the plurality of the slots is provided between two adjacent metal traces.

7. The array substrate according to claim 1, wherein the flexible underlay comprises a flexible underlay body layer and a flexible underlay surface layer.

8. The array substrate according to claim 7, wherein the slots pass through the flexible underlay surface layer.

9. The array substrate according to claim 8, wherein a thickness of the flexible underlay surface layer is equal to the depth of the slot.

10. The array substrate according to claim 9, wherein the flexible underlay surface layer is a patterned flexible underlay surface layer, and a hollow region of the flexible underlay surface layer and the flexible underlay body layer constitute the slot.

11. The array substrate according to claim 1, wherein a width of the first inorganic film layer is greater than a width of the peripheral metal trace.

12. The array substrate according to claim 1, wherein the flexible underlay is a single layer structure.

13. A manufacturing method of an array substrate, the array substrate comprising a non-display region, the manufacturing method of the non-display region comprising:
providing a flexible underlay;
forming slots on the flexible underlay, a cross-section of a sidewall of the slots being configured as arc-shaped;
forming a first inorganic film layer on a surface of the flexible underlay;
forming a second inorganic film layer on a bottom wall of the slots; and
forming a peripheral metal trace on a surface of the first inorganic film layer.

14. The manufacturing method of the array substrate according to claim 13, wherein the forming of the slots on the flexible underlay comprises:
providing a flexible underlay body layer; and
forming a patterned flexible underlay surface layer on the flexible underlay body layer such that a hollow region of the flexible underlay surface layer and the flexible underlay body layer form the slots.

15. An array substrate, comprising a display region and a non-display region located outside the display region, the non-display region comprising:
a flexible underlay, the flexible underlay having a plurality of slots defined on a surface thereof, the plurality of slots including a pair of adjacent slots, a region positioned between the adjacent slots on the flexible underlay being a trace region;
an inorganic film layer comprising a first inorganic film layer formed in the trace region and a second inorganic film layer formed on a bottom wall of the plurality of slots, the first inorganic film layer and the second inorganic film layer being divided by sidewalls of the slots; and
a peripheral metal trace formed on the surface of the first inorganic film layer;
wherein a cross-section of the sidewalls of the slots is arc-shaped.

16. The array substrate according to claim 15, wherein angles between the sidewalls of the slots and the bottom walls of the slots are less than 90 degrees.

17. The array substrate according to claim 15, wherein the flexible underlay comprises a flexible underlay body layer and a flexible underlay surface layer.

18. The array substrate according to claim 17, wherein the flexible underlay surface layer is a patterned flexible underlay surface layer, and a hollow region of the flexible underlay surface layer and the flexible underlay body layer constitute the slot.

19. The array substrate according to claim 15, wherein a width of the first inorganic film layer is greater than a width of the peripheral metal trace.

20. The array substrate according to claim 15, wherein the array substrate further comprises a protective layer formed on a surface of the peripheral metal trace.

* * * * *